(12) United States Patent
Gundogan et al.

(10) Patent No.: US 7,262,972 B1
(45) Date of Patent: Aug. 28, 2007

(54) ELECTRONIC SYSTEM HAVING SPACE-EFFICIENT FRONT PANEL ASSEMBLY

(75) Inventors: C. Ilhan Gundogan, Lexington, MA (US); W. Brian Cunningham, Westborough, MA (US); Gerald J. Cote, Westborough, MA (US); Lawrence J. Feroli, W. Townsend, MA (US)

(73) Assignee: EMC Corporation, Hopkinton, MA (US)

( * ) Notice: Subject to any disclaimer, the term of this patent is extended or adjusted under 35 U.S.C. 154(b) by 379 days.

(21) Appl. No.: 11/022,509

(22) Filed: Dec. 22, 2004

(51) Int. Cl.
*H05K 9/00* (2006.01)
(52) U.S. Cl. ...................... 361/726; 361/818
(58) Field of Classification Search ................ 361/797, 361/686, 728, 740, 741, 747, 759; 174/724–727
See application file for complete search history.

(56) References Cited

U.S. PATENT DOCUMENTS

| | | | |
|---|---|---|---|
| 5,388,032 A | 2/1995 | Gill et al. ..................... 700/17 |
| D421,431 S | 3/2000 | Mazzetti et al. ........... D14/442 |
| D421,977 S | 3/2000 | Wong ....................... D14/444 |
| D447,485 S | 9/2001 | Carbonneau et al. ...... D14/445 |
| 6,297,948 B1 | 10/2001 | Buican et al. .............. 361/683 |
| D454,881 S | 3/2002 | Daniels et al. ............. D14/446 |
| D455,754 S | 4/2002 | Gant et al. ................. D14/446 |
| 6,477,055 B1 | 11/2002 | Bolognia et al. ........... 361/724 |
| D477,485 S | 7/2003 | Hoernig ...................... D6/548 |
| D486,494 S | 2/2004 | Gundogan et al. ......... D14/444 |
| D496,050 S | 9/2004 | Gundogan et al. ......... D14/444 |
| 6,826,057 B1 * | 11/2004 | Gundogan et al. .......... 361/726 |

\* cited by examiner

*Primary Examiner*—Tuan T. Dinh
*Assistant Examiner*—Ivan Carpio
(74) *Attorney, Agent, or Firm*—Bainwood Huang

(57) ABSTRACT

An improved front panel assembly is capable of being used with an electronic equipment rack. The improved front panel assembly includes a cover, an attachment subassembly configured to attach the cover to the electronic equipment rack, and a metallic EMI shield. The cover includes (i) a central portion configured to separate an external space in front of the electronic equipment rack and an internal space within the electronic equipment rack, and (ii) side portions which extend around a periphery of the metallic EMI shield. The side portions are configured to elevate and support the central portion from the metallic EMI shield. The central portion and the side portions define a top slot which extends horizontally along a top outer edge of the central portion and a bottom slot which extends horizontally along a bottom outer edge of the central portion.

20 Claims, 4 Drawing Sheets

US 7,262,972 B1

ELECTRONIC SYSTEM HAVING SPACE-EFFICIENT FRONT PANEL ASSEMBLY

BACKGROUND

Some conventional data storage systems are designed to mount to electronic equipment racks. One conventional rack mount data storage system includes a rack mount chassis, storage circuitry and a front panel. The rack mount chassis mounts to vertical rails of an electronic equipment rack and resides within an interior space defined by that rack. The storage circuitry (e.g., an array of disk drives, processing circuitry configured to perform data storage operations, etc.) sits within the chassis. The front panel then secures to the rack or to the front of the chassis to enable frontal access to the data storage system.

Typically, the front panels of rack mount data storage systems have standard heights which are measured in Rack Units. A Rack Unit (U) is 1.75 inches and typically covers the distance of several mounting holes along the vertical rails at the front of the rack. It is common for a conventional 19-inch data storage system chassis to have a height in whole U-increments within the range of 3 U's to 6 U's.

For a manufacturer of rack mount data storage systems having distinguished looking patterns on front panels in the range of 3 U's to 6 U's in height, it can be difficult to scale down the patterns for a front panel which is less than 3 U's to 6 U's in height in an effort to preserve the distinguished look for a cohesive appearance to a line of products (e.g., a similar looking panel for a smaller-sized system or subsystem). This is because the front panel needs to provide adequate space for particular useful features such as air ducts, LED visibility, posts for rigidly supporting an electromagnetic interference (EMI) shield, buttons for detaching the front panel, and a keyhole for locking the front panel to the rack. As the height of the front panel shrinks (e.g., such as when a manufacture attempts to make a front panel which is similar looking to a larger existing front panel), these features tend to crowd toward each other and compete for space which ultimately may prevent the manufacturer from providing a front panel which preserves the distinguished look.

SUMMARY

In contrast to the above-described conventional front panel, there is an improved front panel assembly having a cover which defines top and bottom slots extending horizontally adjacent top and bottom edges of the cover. Such a cover is capable of providing robust ventilation between an internal space of an electronic equipment rack which supports the front panel assembly and an external space in front of the electronic equipment rack. Additionally, the top and bottom slots provide convenient tooling access which enables a manufacturer to implement simple injection molding techniques to create snap members for holding an EMI shield in a floating manner that reduces required installation force. Furthermore, the top and bottom slots alleviate the need to utilize a significant amount of additional cover space for airflow thus enabling the manufacturer to locate other features (e.g., distinctive patterns, buttons, etc.) in the remaining portions of the cover.

The improved front panel assembly is capable of being used with an electronic equipment rack (e.g., for covering an opening to a chassis that houses a data storage system). Along these lines, the improved front panel assembly includes a cover, an attachment subassembly configured to attach the cover to the electronic equipment rack, and a metallic EMI shield. The cover includes (i) a central portion configured to separate an external space in front of the electronic equipment rack and an internal space within the electronic equipment rack, and (ii) side portions which extend around a periphery of the metallic EMI shield. The side portions are configured to elevate and support the central portion from the metallic EMI shield. The central portion and the side portions define a top slot which extends horizontally along a top outer edge of the central portion and a bottom slot which extends horizontally along a bottom outer edge of the central portion.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved front panel assembly has a cover which defines top and bottom slots extending horizontally adjacent top and bottom edges of the cover. Such a cover is capable of providing robust ventilation between an internal space of an electronic equipment rack which supports the front panel assembly and an external space in front of the electronic equipment rack. Additionally, the top and bottom slots provide convenient tooling access which enables a manufacturer to implement simple injection molding techniques to create snap members for holding an electromagnetic interference (EMI) shield in a floating manner that reduces required installation force. Furthermore, the top and bottom slots alleviate the need to utilize a significant amount of additional cover space for airflow thus providing the manufacturer more area in the remaining portions of the cover to locate other features (e.g., distinctive patterns, buttons, etc.).

Figure 1:
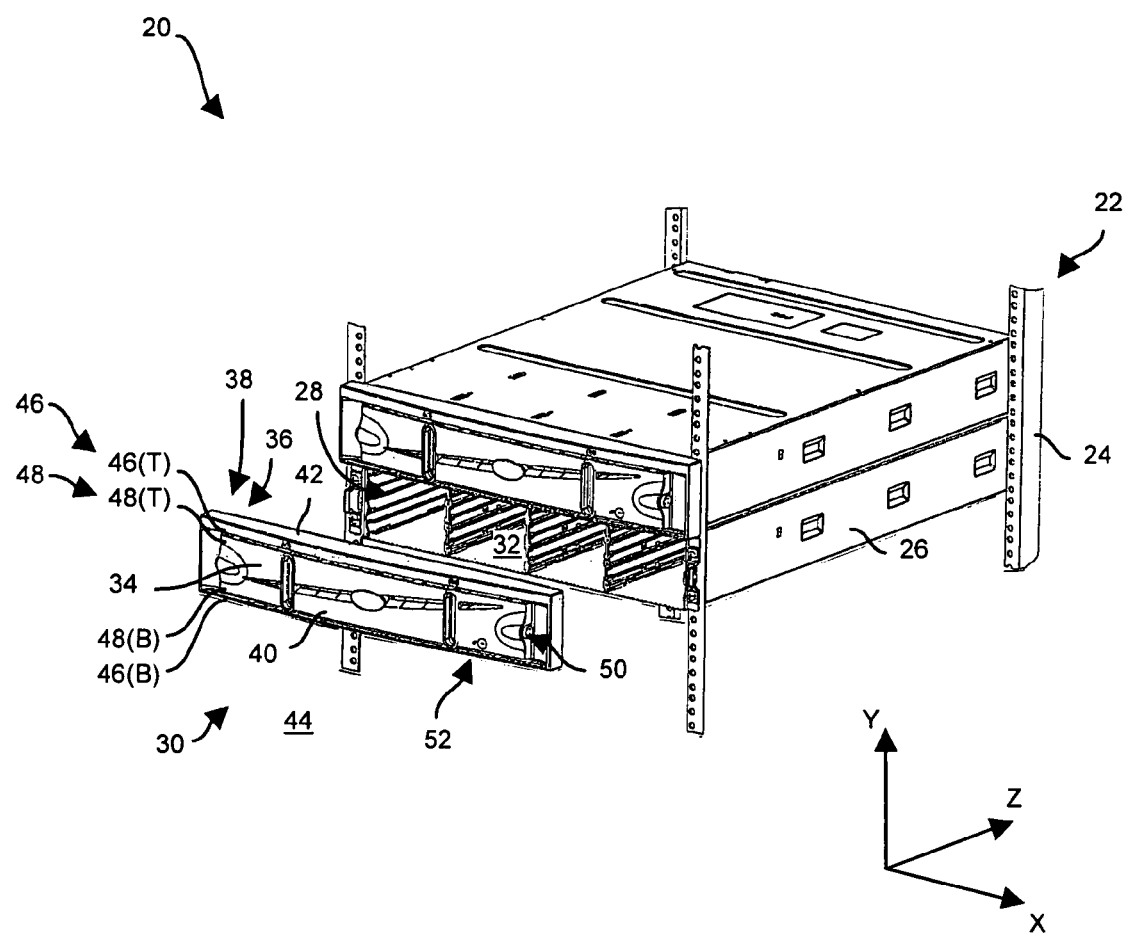
FIG. 1 shows a perspective view of an electronic system having a space-efficient front panel assembly.

FIG. 1 shows an electronic system 20 which is suitable for use by the invention. The electronic system 20 is configured to mount to an electronic equipment rack 22 having a set of vertical support members 24. The electronic system 20 includes a frame 26, electronic circuitry 28 (shown generally by the arrow 28 in FIG. 1) and a front panel assembly 30. The frame 26 is configured to fasten to the electronic equipment rack 22. The frame 26 defines an internal space 32 and is further configured to support the electronic circuitry 28 within the internal space 32.

The front panel assembly 30 includes a cover 34, an attachment subassembly 36 and a metallic EMI shield 38. Preferably, the cover 34 is relatively short in height (e.g., 2 U's in height) and includes a central portion 40 and side portions 42. The central portion 40 is configured to separate the internal space 32 from an external space 44 in front of the frame 26. The side portions 42, which extend around a periphery of the EMI shield 38, are configured to elevate and support the central portion 40 from the EMI shield 38 and thus provide space for enclosing components of the attachment subassembly 36 (e.g., a locking and releasing mechanism). The central portion 40 and the side portions 42 define a top slot 46(T) which extends substantially horizontally along a top outer edge 48(T) of the central portion 40 and a bottom slot 46(B) which extends substantially horizontally along a bottom outer edge 48(B) of the central portion 40.

The attachment subassembly 36 couples to the cover 34 and is configured to attach the cover 34 to the frame 26 and the rack 22 as well as detach the cover 34 from the frame 26 and the rack 22. In some arrangements, the attachment subassembly 36 includes buttons 50 which detach the front panel assembly 30 when the buttons 50 are pressed toward each other, and a lock 52 which transitions the front panel assembly 30 between and locked state and an unlocked state in response to turning of a key. The metallic EMI shield 38 couples to the cover 34 in a floating manner which will be explained in further detail shortly. Due to this manner of coupling the metallic EMI shield 38 to the cover 34, a minimal amount of installation force is required by a user when the user attaches the cover 34 to the frame 26 and the rack 22.

By way of example only, the electronic system 20 is a scalable data storage system which is capable of expanding beyond a single frame 26, the electronic circuitry 28 and the front panel assembly 30. To increase the capacity of the electronic system 20 (e.g., to increase the amount of storage, processing power, fault tolerance capabilities, etc.), a user is capable of adding another frame 26, additional electronic circuitry 28 and another front panel assembly 30 in a stacking manner within the electronic equipment rack 22, as shown in FIG. 1. Further details of the invention will now be provided with reference to FIG. 2.

Figure 2:
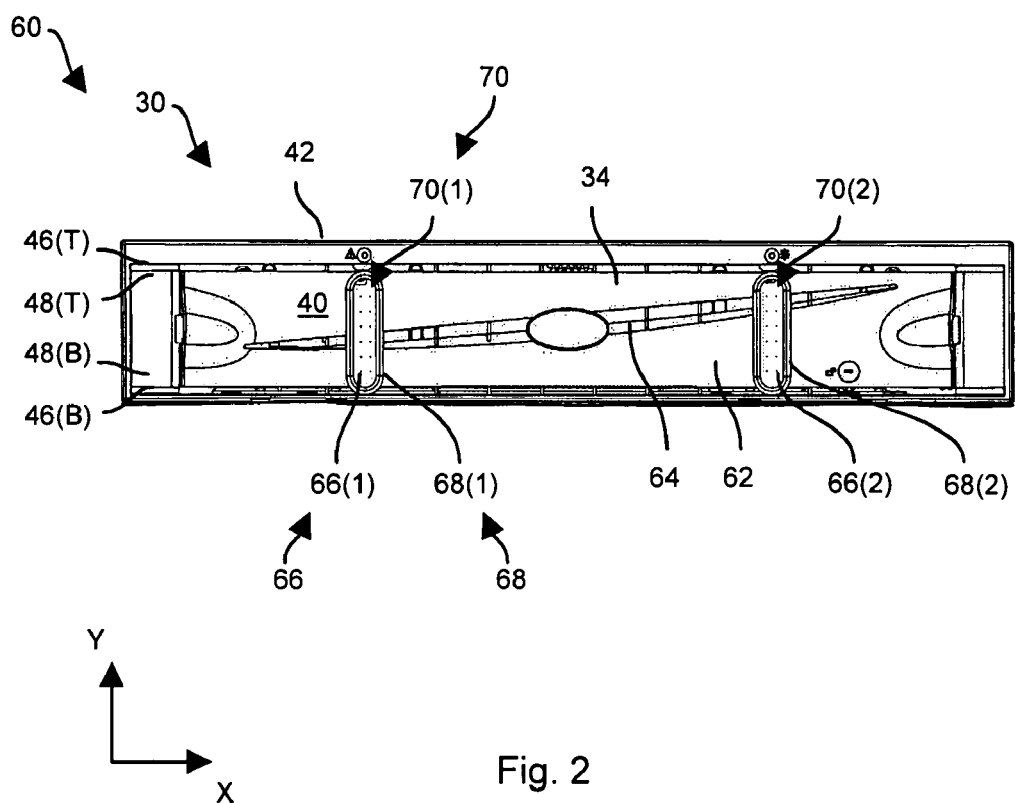
FIG. 2 shows a detailed frontal view of the front panel assembly of FIG. 1.

FIG. 2 shows a detailed frontal view 60 of the front panel assembly 30. The central portion 40 includes a face section 62 which is disposed between the buttons 50 of the attachment subassembly 36. The face section 62 defines (i) a single crescent-shaped opening pattern 64, and (ii) multiple oval openings 66(1), 66(2) which cross the single crescent-shaped opening pattern 64 and which are wider (e.g., taller in the Y-direction) than the single crescent-shaped opening pattern 64. The face section 62 includes respective chrome finish pieces 68(1), 68(2) (collectively, finish pieces 68) which border the oval openings 66(1), 66(2) (collectively, oval openings 66).

The configuration of openings 64/66 is particularly useful in a relatively short-height panel devices such as the front panel assembly 30. In particular, the openings 64/66, in combination with the horizontal slots 46 along the outer edges 48 of the central portion 40, allow a robust amount of air to pass between the external space 44 and the internal space 32 for reliable cooling of the electronic circuitry 28 (FIG. 1). In some applications, the amount of air passing through the horizontal slots 46 alone or through the openings 64/66 alone could be insufficient thus making the contribution of all slots 46 and openings 64/66 significant.

Additionally, in contrast to conventional panel devices which define holes for air and separate holes for visual access to circuitry, the multiple oval openings 66 further provide a viewing window for a user to see status indicators 70 of the electronic circuitry 28. In particular, the electronic circuitry 28 includes a first two-dimensional array of LEDs 70(1) (e.g., 2×6) and a second two-dimensional array of LEDs 70(2). In some arrangements, the first two-dimensional array of LEDs 70(1) belongs from two stacks of disk drives housed within the frame 26. Similarly, the second two-dimensional array of LEDs 70(2) belongs to another two stacks of disk drives housed within the frame 26. In some arrangements, light from the LED array 70(1) reflects off of the finish piece 68(1) while passing through the opening 66(1), and light from the LED array 70(2) reflects off of the finish piece 68(2) while passing through the opening 66(2), for enhanced LED visibility to a user standing in front of the system 20.

It should be understood that, due to the sufficiency of air passage through the pattern 64, the openings 66 and the slots 46, additional air ducts through the face section 62 are unnecessary. Accordingly, the face section 62 enjoys a substantial amount of remaining surface area which enables the manufacturer to shape the pattern 64 distinctively in order to match other larger panel devices offered by the manufacturer, if desired. As a result, in some arrangements, the single crescent-shaped opening pattern 64 is configured to match a "swoop-like" appearance of other larger panel devices where one end of the pattern 64 is intentionally lower than another end of the pattern 64, and where the pattern 64 curves in an upward manner, thus providing a distinctive look which matches larger panel devices of a common product line. Further details of the front panel assembly will now be provided with reference to FIGS. 3 and 4.

Figure 3:
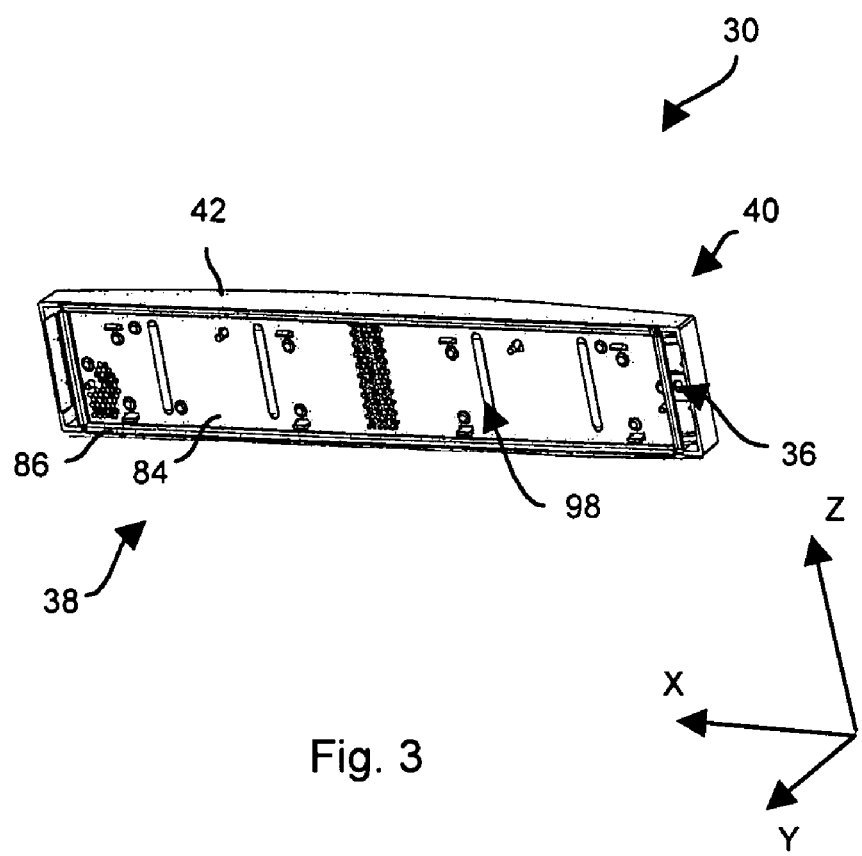
FIG. 3 shows a detailed perspective rear view of the front panel assembly of FIG. 1.
Figure 4:
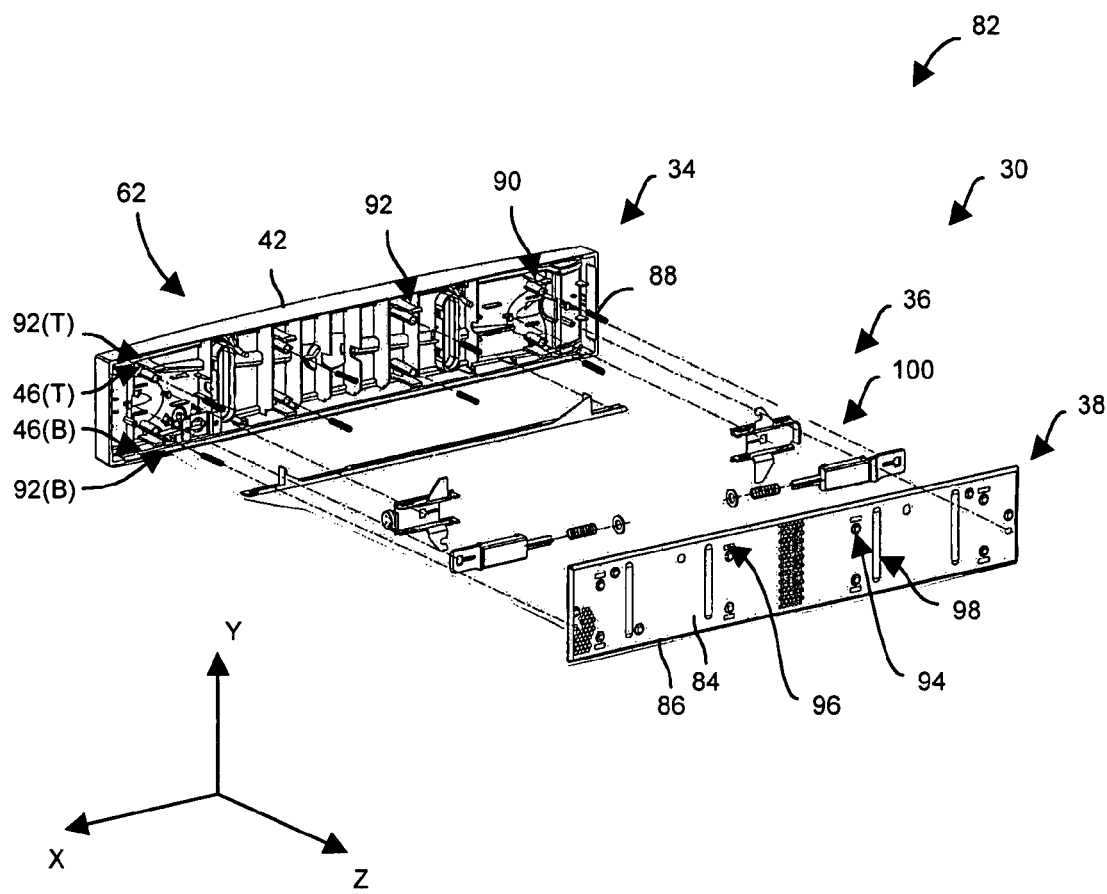
FIG. 4 shows an exploded view of the front panel assembly of FIG. 1.

FIG. 3 shows a detailed perspective rear view 80 of the front panel assembly 30, and FIG. 4 shows an exploded view 82 of the front panel assembly 30. The EMI shield 38 includes a planar metal screen member 84 (e.g., stamped sheet metal), a compressible gasket material 86 (e.g., metallic fabric) which extends around a periphery of the planar metal member 84, and a set of coil springs 88. The central portion 40 of the cover 34 defines cavities 90 and snaps 92 (e.g., ramped detention elements configured to catch and retain portions of the planar metal screen member 84), both of which are distributed across the central portion 40. The planar metal member 84 defines snap apertures 96 configured to receive the snaps 92, spring depressions 94 configured to locate ends of the springs 88, and holes 98 which align with the two-dimensional arrays of LEDs 70 and the oval openings 66.

To assemble the front panel assembly 30, components 100 of the attachment subassembly 36 (FIG. 4) install onto the central portion 40. Next, the coil springs 88 insert into the cavities 90, and the snaps 92 insert through the snap apertures 96. As a result, the snaps 92 hold the planar metal screen member 84 in a substantially fixed position relative to the X and Y directions, but allow the planar metal screen member 84 to float in the Z-direction. At this point, the springs 88 align with the spring depressions 94 defined by the planar metal member 84 and bias the member 84 away from the central portion 40, i.e., away from the face section 62.

It should be understood that the above-described configuration makes the amount of force required to install the front panel assembly 30 onto the rack 22 and the frame 26 substantially independent of precise dimensions of the side portions 42 (also see FIG. 1) or locations of the frame 26. Rather, the amount of such force is capable of being precisely controlled by compression characteristics of the springs 88 and the gasket material 86 which typically do not vary significantly. In particular, to install the front panel assembly 30, a user simply moves the front panel assembly 30 toward the rack 22 and the frame 26 until the user overcomes the compression forces of the springs 88 and the gasket material 86. In response, the distance between the central portion 40 and the EMI shield 38 shrinks in a compliance fit manner until the attachment subassembly 36 of the front panel assembly 30 latches to the rack 22 and the frame 26. Accordingly, the design of the front panel assembly 30 is substantially impervious to tolerance stack-up which is a susceptibility concern for conventional panel devices which do not have a floating EMI shield.

In some arrangements, the snaps 92 include a top row of snap members 92(T) which extend from the face section 62 and are adjacent to the top slot 46(T). The top snap members 92(T) are spaced apart from each other along the top outer edge 48(T) of the central portion 40 of the cover 34. Similarly, the snaps 92 further include a bottom row of snap members 92(B) which extend from the face section 62 and are adjacent to the bottom slot 46(B). The bottom snap members 92(B) are spaced apart from each other along the bottom outer edge 48(B) of the central portion 40 of the cover 34. For these arrangements, a manufacturer is capable of forming the cover 34 using a simple injection molding process. In particular, tooling is capable of passing through the horizontal slots 46 to reliably form catching surfaces of the snaps 92 thus alleviating the need for complex molding procedures, or subsequent gluing steps. Rather, the cover 34 can be made from a single molding step with the horizontal slots 46 performing multiple roles, i.e., holes which allow convenient access to tooling equipment during manufacturing, and holes which allow air to pass for enhance airflow between the external space 44 and the internal space 32 during installation in the field.

As described above, there is an improved front panel assembly 30 having a cover 34 which defines top and bottom slots 46 extending horizontally adjacent top and bottom edges 48 of the cover 34. Such a cover 34 is capable of providing robust ventilation between an internal space 32 of an electronic equipment rack 22 which supports the front panel assembly 30 and an external space 44 in front of the electronic equipment rack 22. Additionally, the top and bottom slots 46 provide convenient tooling access which enables a manufacturer to implement simple injection molding techniques to create snap members 92 for holding an EMI shield 38 in a floating manner that reduces required installation force. Furthermore, the top and bottom slots 46 alleviate the need to utilize a significant amount of additional cover space for airflow thus providing the manufacturer more area in the remaining portions of the cover 34 to locate other features (e.g., distinctive patterns, buttons, etc.).

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic system, comprising: a frame defining an internal space; electronic circuitry supported by the frame within the internal space; and a front panel assembly having: a cover, an attachment subassembly coupled to the cover, the attachment subassembly being configured to attach the cover to the frame, a metallic electromagnetic interference shield coupled to the cover, the cover including (i) a central portion configured to separate an external space in front of the frame and the internal space defined by the frame, and (ii) side portions which extend around a periphery of the metallic electromagnetic interference shield, the side portions being configured to elevate and support the central portion from the metallic electromagnetic interference shield, the central portion including a face section coupled to the side portions, the central portion and the side portions defining a top slot which extends horizontally along a top outer edge of the central portion and a bottom slot which extends horizontally along a bottom outer edge of the central portion, and a set of springs retained between the face section and the metallic electromagnetic interference shield, the set of springs being configured to bias the metallic electromagnetic interference shield in a direction away from the face section.

2. The electronic system of claim 1 wherein the metallic electromagnetic interference shield defines a plane; wherein the metallic electromagnetic interference shield is configured to fasten to the central portion of the cover; and wherein a distance between (i) the central portion of the cover and (ii) the plane defined by the metallic electromagnetic interference shield is configured to change in a compliance fit manner during installation of the front panel assembly with the frame.

3. The electronic system of claim 2 wherein the metallic electromagnetic interference shield defines a set of snap apertures; and wherein the central portion of the cover further includes: a set of snap members coupled to the face section, the set of snap members being configured to pass through the set of snap apertures to fasten the metallic electromagnetic interference shield to the cover.

4. The electronic system of claim 3 wherein the metallic electromagnetic interference shield is capable of sliding along the set of snap members in a floating manner.

5. The electronic system of claim 3 wherein the metallic electromagnetic interference shield includes:
a screen member; and
compressible metallic material coupled to the screen member, the compressible metallic material being configured to compress between the side portions of the cover and the frame.

6. The electronic system of claim 3 wherein the set of snap members include:
top snap members extending from the face section and being adjacent to the top slot, the top snap members being spaced apart from each other along the top outer edge of the central portion of the cover; and
bottom snap members extending from the face section and being adjacent to the bottom slot, the bottom snap members being spaced apart from each other along the bottom outer edge of the central portion of the cover.

7. The electronic system of claim 1 wherein the face section defines (i) a single crescent-shaped opening pattern, and (ii) multiple oval openings which cross the single crescent-shaped opening pattern and which are wider than the single crescent-shaped opening pattern, wherein air is capable of passing through both the single crescent-shaped opening pattern and the multiple oval openings defined by the face section.

8. The electronic system of claim 7 wherein the electronic circuitry includes a first two-dimensional array of LEDs and a second two-dimensional array of LEDs; wherein the face section defines, as the multiple oval openings, (i) a first oval opening to allow light from the first two-dimensional array of LEDs to pass therethrough, and (ii) a second oval opening to allow light from the second two-dimensional array of LEDs to pass therethrough.

9. The electronic system of claim 8 wherein the face section includes:
a first chrome finish which borders the first oval opening; and
a second chrome finish which borders the second oval opening.

10. The electronic system of claim 8 wherein the attachment subassembly includes:

buttons which, when pressed toward each other, are configured to detach the front panel assembly from the frame, the first and second oval openings defined by the face section being disposed between the buttons.

11. A front panel assembly for an electronic equipment rack, the front panel assembly comprising: a cover; an attachment subassembly coupled to the cover, the attachment subassembly being configured to attach the cover to the electronic equipment rack; a metallic electromagnetic interference shield coupled to the cover, the cover including (i) a central portion configured to separate an external space in front of the electronic equipment rack and an internal space within the electronic equipment rack, and (ii) side portions which extend around a periphery of the metallic electromagnetic interference shield, the side portions being configured to elevate and support the central portion from the metallic electromagnetic interference shield, the central portion including a face section coupled to the side portions, the central portion and the side portions defining a top slot which extends horizontally along a top outer edge of the central portion and a bottom slot which extends horizontally along a bottom outer edge of the central portion; and a set of springs retained between the face section and the metallic electromagnetic interference shield, the set of springs being configured to bias the metallic electromagnetic interference shield in a direction away from the face section.

12. The front panel assembly of claim 11 wherein the metallic electromagnetic interference shield defines a plane; wherein the metallic electromagnetic interference shield is configured to fasten to the central portion of the cover; and wherein a distance between (i) the central portion of the cover and (ii) the plane defined by the metallic electromagnetic interference shield is configured to change in a compliance fit manner during installation of the front panel assembly with the electronic equipment rack.

13. The front panel assembly of claim 12 wherein the metallic electromagnetic interference shield defines a set of snap apertures; and wherein the central portion of the cover further includes: a set of snap members coupled to the face section, the set of snap members being configured to pass through the set of snap apertures to fasten the metallic electromagnetic interference shield to the cover.

14. The front panel assembly of claim 13 wherein the metallic electromagnetic interference shield is capable of sliding along the set of snap members in a floating manner.

15. The front panel assembly of claim 13 wherein the metallic electromagnetic interference shield includes:

a screen member; and compressible metallic material coupled to the screen member, the compressible metallic material being configured to compress between the side portions of the cover and the electronic equipment rack when the front panel assembly installs onto the electronic equipment rack.

16. The front panel assembly of claim 13 wherein the set of snap members include:

top snap members extending from the face section and being adjacent to the top slot, the top snap members being spaced apart from each other along the top outer edge of the central portion of the cover; and bottom snap members extending from the face section and being adjacent to the bottom slot, the bottom snap members being spaced apart from each other along the bottom outer edge of the central portion of the cover.

17. The front panel assembly of claim 11 wherein the face section defines (i) a single crescent-shaped opening pattern, and (ii) multiple oval openings which cross the single crescent-shaped opening pattern and which are wider than the single crescent-shaped opening pattern, wherein air is capable of passing through both the single crescent-shaped opening pattern and the multiple oval openings defined by the face section.

18. The front panel assembly of claim 17 wherein the face section defines, as the multiple oval openings, (i) a first oval opening to allow light from a first two-dimensional array of LEDs to pass therethrough, and (ii) a second oval opening to allow light from a second two-dimensional array of LEDs to pass therethrough.

19. The front panel assembly of claim 18 wherein the face section includes:

a first chrome finish which borders the first oval opening; and a second chrome finish which borders the second oval opening.

20. The front panel assembly of claim 18 wherein the attachment subassembly includes:

buttons which, when pressed toward each other, are configured to detach the front panel assembly from the electronic equipment rack, the first and second oval openings defined by the face section being disposed between the buttons.

* * * * *